United States Patent [19]

Owen

[11] Patent Number: 5,225,731
[45] Date of Patent: Jul. 6, 1993

[54] SOLID BODY PIEZOELECTRIC BENDER TRANSDUCER

[75] Inventor: Thomas E. Owen, Helotes, Tex.

[73] Assignee: Southwest Research Institute, San Antonio, Tex.

[21] Appl. No.: 714,929

[22] Filed: Jun. 13, 1991

[51] Int. Cl.$^5$ .......................................... H01L 41/08
[52] U.S. Cl. ..................................... 310/366; 310/357
[58] Field of Search ............... 310/328, 330, 357, 358, 310/359, 366, 368, 369

[56] References Cited

U.S. PATENT DOCUMENTS

| | | | |
|---|---|---|---|
| 2,540,412 | 2/1951 | Adler | 310/359 |
| 2,614,143 | 10/1952 | Williams | 171/327 |
| 2,828,470 | 3/1958 | Mason | 310/333 |
| 2,961,635 | 11/1960 | Trott | 310/337 |
| 3,027,540 | 3/1962 | Howatt | 340/10 |
| 3,071,841 | 1/1963 | Brussaard et al. | 310/358 |
| 3,168,623 | 2/1965 | Petermann | 179/100.41 |
| 3,177,382 | 4/1965 | Green | 310/8.7 |
| 3,213,207 | 10/1965 | Munk | 310/328 |
| 3,215,078 | 11/1965 | Stec | 103/1 |
| 3,325,780 | 6/1967 | Horan | 310/328 |
| 3,365,592 | 1/1968 | Krautwald et al. | 310/331 |
| 3,447,217 | 6/1969 | Kumada | 29/25.35 |
| 3,531,742 | 9/1970 | Saito et al. | 310/321 |
| 3,543,059 | 11/1970 | Angeloff | 310/8.7 |
| 3,845,333 | 10/1974 | Holloway | 310/9.5 |
| 4,135,109 | 1/1979 | Gingerich | 310/369 |
| 4,220,887 | 9/1980 | Kompanek | 310/334 |
| 4,347,593 | 8/1982 | Trott | 367/139 |
| 4,376,302 | 3/1983 | Miller | 310/358 |
| 4,525,645 | 6/1985 | Shirley et al. | 310/337 |
| 4,678,956 | 7/1987 | Izukawa et al. | 310/323 |
| 4,706,229 | 11/1987 | Congdon | 310/369 |

FOREIGN PATENT DOCUMENTS 0289683 12/1986 Japan .................... 310/359

Primary Examiner—Steven L. Stephan
Assistant Examiner—C. LaBalle
Attorney, Agent, or Firm—Baker & Botts

[57] ABSTRACT

A piezoelectric transducer having a solid body with electrode strips either attached to the body or embedded within it. The electrodes are electrically isolated from each other on the body of the transducer and are arranged in a pattern so that they may be selectively connected to a voltage source to produce electromechanical forces within the body, thereby causing associated vibrations of the body. Initially, the electrode strips are used to polarize the transducer. During operation of the transducer as a vibration source, the electrode strips are used to connect an applied voltage having a polarity opposite to that of the polarizing voltage on one face of the body. The transducer is especially useful for producing flexural vibrations, but a number of other vibration modes of operation are possible. The transducer is operable either as a vibration source or as a sensor.

7 Claims, 5 Drawing Sheets

SOLID BODY PIEZOELECTRIC BENDER TRANSDUCER

TECHNICAL FIELD OF THE INVENTION

This invention relates to piezoelectric transducers, and more particularly to transducers that provide flexural bending motion without the need for composite assemblies.

BACKGROUND OF THE INVENTION

Piezoelectric transducers are used in many technologies, including mechanical actuators or sonic and ultrasonic sources by applying an excitation voltage to their electrodes, or as sensors of stress or vibratory motions by detecting the voltage generated by the transducer when it is subjected to a mechanical force. Basically, the piezoelectric effect is an interrelationship between mechanical distortion and electrical effects, peculiar to certain crystalline materials. The nature and magnitude of a piezoelectric effect in a substance are dependent on the direction of applied force or electric field with respect to the crystallographic axes of the substance, i.e., it polarization. This polarization is one of several factors that determine the motion of a piezoelectric transducer, with other factors being the shape of the transducer, the manner in which the transducer is energized, and the manner in which two or more piezoelectric elements may be assembled to form a composite transducer.

Piezoelectric transducers made from polarized ceramic materials are especially useful because of their high piezoelectric sensitivity and geometric formability. Existing piezoelectric ceramic transducers have a number of shapes, such as disks, plates, rods, and cylinders.

Composite piezoelectric transducers consist of two or more bars, plates, or cylinders, rigidly bonded together. One form of composite transducer is a planar assembly, in which one piezoelectric plate is bonded to either another piezoelectric plate or to a passive plate. These transducers may be polarized and energized to form longitudinal extender transducers or bender transducers. Bender transducers are referred to as such, because, when activated, their motion involves flexural bending of the composite assembly relative to the planar surface of the transducer when not activated. Another form of composite piezoelectric transducer is cylindrical in shape. These transducers have assemblies of adjacent sections or of an inner and outer cylinder. They may be polarized radially, i.e., through their thickness, or axially, i.e., along the length of the axis. When polarized, they may be energized to undergo uniform expansion and contraction or to undergo flexural motion of the cylinder walls. The latter transducers are referred to as bender transducers.

Composite cylindrical transducers are the subject of U.S. Pat. No. 4,525,645, entitled "Cylindrical Bender-pending Type Vibration Transducer",issued Jun. 25, 1985, and co-pending U.S. Pat. No. 07/406,797, entitled "Piezoelectric Cylindrical Transducer for Producing or Detecting Asymmetrical Vibrations", filed Sep. 13, 1989. U.S. Pat. No. 4,525,645 and U.S. Pat. No. 07/406,797 are both assigned to the same assignee as the present invention.

Although composite transducers are successful in application, their structure makes them relatively expensive to make. Also, they are subject to limitations imposed by parts tolerances, by physical properties of the bonding material used to form the composite, and by the need for means for attaching electrodes.

A need exists for a transducer that produces the flexural motion of a composite transducer, but is more easily manufactured.

SUMMARY OF THE INVENTION

A first aspect of the invention is a piezoelectric transducer for generating or receiving mechanical vibrations. The transducer has a body made from a piezoelectric material, typically a ceramic. This body has a predetermined shape, either a bar or a cylinder, with either of these shapes having two faces, i.e., the front and back of the bar or the inner and outer surface of a cylinder. Electrode strips are in contact with the body, either by being attached to the surface or embedded in the body, at spaced intervals down each face of the body. Each electrode strip at one face of the body corresponds to an opposing electrode strip at the other face of the body. The strips connect the transducer to a voltage source, and may thus be selectively energized.

Various configurations of the invention can be used to produce various motions or detect various forces. The invention is especially useful for producing flexural bending motion, such as is conventionally generated using composite bender transducers.

A technical advantage of the invention is that it provides a piezoelectric transducer with a solid monolithic body. Although the transducer will produce the same motions as composite transducers, the number of ceramic elements and other parts and materials is reduced as compared to composite transducers. This results in cost savings and simplification of the end product transducer. The monolithic fabrication of the invention also improves the operation of the transducer, especially with respect to electromechanical energy conversion efficiency.

DETAILED DESCRIPTION OF THE INVENTION

A basic concept of the invention is the use of electrode strips as part of the structure of a piezoelectric transducer. These strips are in contact with the body of the transducer, such as by being attached to the surface or embedded in the transducer body. The electrode strips connect the transducer to a voltage source, and are initially used to polarize the transducer, and in operation, may be used to cause the transducer to undergo flexural bending. Although the following description is primarily directed to operation of transducers as sources, the same principles apply when the transducers described herein as used as sensors. If used as a sensor, the transducers move in response to an applied force and this motion causes the transducers to generate a response voltage. For this purpose, the transducers are polarized and connected to a voltage detecting means rather than being subjected to an applied operational voltage.

The following description is directed to a number of embodiments of the invention, with the primary distinguishing characteristics being the shape of the transducer and the manner in which electrode strips are incorporated into the transducer's structure. As will be explained, a feature of the invention is that a transducer may be virtually divided into composite elements by selectively using the electrode strips to polarize and energize the transducer. Thus, the invention provides a transducer that may be used in place of composite transducers.

With regard to the shape of the transducer, the description is in terms of transducer configurations that have bodies in the shape of a bar or a cylinder. Existing composite transducers having these shapes are commonly used for seismic and geophysical acoustic applications. However, the concepts described herein are applicable to replace other types of composite piezoelectric transducers, such as those that use multi-element stacks.

With regard to the use of electrode strips, two variations are described herein. A first variation is the attachment of the electrode strips to the surface of the transducer body. A second variation is the embedding of the electrode strips within the transducer body. As explained below, an advantage of embedded strips is that the internal polarization is uniform within regions defined by the strips.

As will be explained below, operation of the invention involves using the various configurations of the transducer to produce different motions. Depending on the manner in which the transducer is polarized and the method of applying an exciting voltage, the transducer will exhibit symmetrical bending, asymmetrical bending, or longitudinal extension.

In addition to general concepts involving the use of electrode strips, other similarities exist among the various embodiments. Thus, the description of the first embodiment is particularly detailed, with these details being applicable to other embodiments except as stated.

Bar Transducer with Surface Electrode Strips

Figure 1:
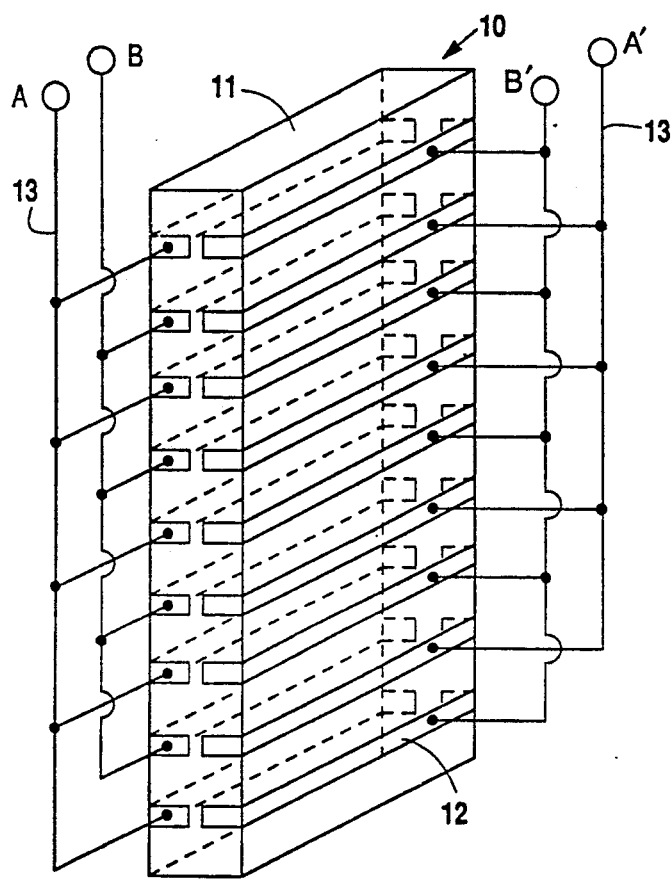
FIG. 1 illustrates a piezoelectric bar transducer having electrode strips attached to the surface of the transducer body.

FIG. 1 illustrates a piezoelectric bar transducer 10, comprised of a bar 11 and electrode strips 12. This embodiment of the invention is characterized by the bar shape and the fact that electrode strips 12 are attached to the surface of bar 11.

Bar 11 is a single body structure, made from piezoelectric ceramic material. This material is preferred because of its versatility in polarization, such as is used to implement the invention.

Bar 11 has dimensions T, W, and L, which represent its thickness, width, and length. For purposes of example in calculations used herein, bar 11 is 0.1 inch thick across each side, 0.5 inch wide across each face, and 3 inches long down each face. The corresponding metric values are 0.00254 meter thick, 0.0127 meter wide, and 0.0762 meter long.

Electrode strips 12 are thin metallic strips, spaced a distance $d_s$ apart. Strips 12 are adhered to the outer surface of bar 11 by one of a number of means of intimate attachment, such as by a fired-on metal and glass frit, by metallic film vacuum deposition, or by paint-on conducting film. Each strip 12 is not continuous around bar 11, but rather has a gap on each end of bar 11 so that different voltages may be applied to the opposite faces of bar 11. Thus, each face of bar 11 has a series of adjacent strips 12 down its length. Each strip 12 on one face of bar 11 corresponds to an opposing strip 12 on the other face of bar 11. Electrode strips 12 are isolated from each other at bar 11, i.e., they do not provide an electrical connection to each other except as provided by leads 13.

Using leads 13, electrode strips 12 are interconnected such that alternating strips 12 on each face of bar 11 may be connected to opposite polarities. For example, a first strip 12 is connected to a positive polarity, the next strip 12 to a negative polarity, the next to a positive polarity, and so forth down the length of bar 11. These polarities may be reversed, so long as adjacent strips 12 have alternating polarities.

As a result of the interconnections of strips 12, each face of transducer 10 has two leads 13 for connecting strips 12 to a voltage source. Thus, transducer 10 has a total of four leads, each of which connect certain strips 12 to a like voltage of the voltage source. These leads are referred to herein as leads A, A', B, and B'. As explained below, the manner in which leads 13 are connected to each other, and thus the relative polarities of opposing strips 12 depends on whether transducer 10 is being polarized or being operated to produce motion.

Figure 2:
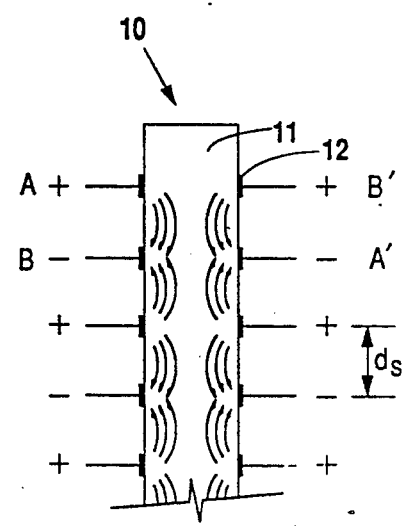
FIG. 2 illustrates the use of electrode strips to polarize of the transducer of FIG. 1.

FIG. 2 illustrates the use of strips 12 to produce an internal polarization of bar 11. Lead A is connected to lead B' and lead B is connected to lead A'. As a result, each strip 12 has the same polarity as its opposing strip 12. In other words, at each distance $d_s$, down each face of bar 11, the applied voltage to adjacent strips 12 changes from one polarity to another, and the applied voltage to opposing strips 12 is the same polarity.

When the polarizing voltage is applied, it is maintained while bar 11 is heated above its Curie temperature and allowed to cool below its Curie temperature. Only after bar 11 is cooled, is the voltage removed. A typical value for the polarizing voltage is the value required to produce an electric field of 60-70 kV per inch between adjacent electrode strips 12. This value may vary, depending on the type of ceramic material used for bar 11. The applied heat is typically about 350 degrees Centigrade.

As a result of the polarization, bar 11 has a polarizing field primarily aligned along its length. However, the polarizing field is not uniform within bar 11, and varies in the region between each pair of adjacent strips 12.

Having been polarized as shown in FIG. 2, transducer 10 can be excited to produce a flexural bending motion. For this purpose, lead A is connected to lead A' and lead B is connected to lead B'. The voltage applied for this purpose is herein referred to as the operational voltage, and causes each strip 12 to have a polarity opposite that of its opposing strip 12.

Figure 3:
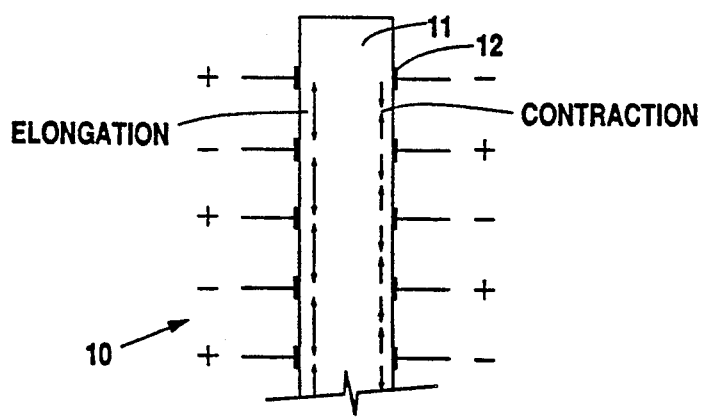
FIG. 3 illustrates the use of electrode strips to operate the transducer of FIG. 1.

FIG. 3 illustrates the operational voltage applied to electrode strips 12, and illustrates the internal effect of the operational voltage. The operational voltage produces a driving field parallel to the polarization field. However, because the operational voltage is opposite from the polarization voltage on one face of bar 11, transducer 10 is, in effect, divided lengthwise into two differently charged parts.

As shown in FIG. 3, piezoelectrically produced stress between positively and negatively charged adjacent strips 12 causes a corresponding strain within the regions in bar 11 defined by strips 12. On one face of bar 11, the applied voltage is the same as the polarization voltage, and the resulting effect is internal positive stresses, which cause that part of bar 11 to become elongated. On the other face of bar 11, the operational voltage is opposite from the polarization voltage, and the result is internal negative stresses, which cause that part of bar 11 to contract.

Figure 4:
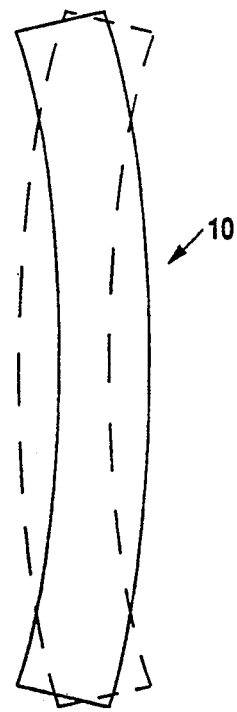
FIG. 4 illustrates the transducer motion when energized as shown in FIG. 3.

FIG. 4 illustrates the bending motion of transducer 10 as a result of the operational voltage illustrated in FIG. 3. If the voltage is oscillatory, the internal stresses result in a flexural motion, back and forth in accordance with the changing polarity. Transducer 10 exhibits natural resonance frequencies and modes of vibration. Any of these modes may be excited by applying an alternating voltage whose frequency corresponds to the mode frequency.

The motion of transducer 10 can be modeled mathematically. A piezoelectric strain constant of the ceramic material used for bar 11, $d_{33}$, represents the strain parallel to the direction of polarization. A typical value of $d_{33}$ is $400 \times 10^{-12}$ meter/volt. A second strain constant, $d_{31}$, represents the strain transverse to the direction of polarization. A typical value of $d_{31}$ is $-185 \times 10^{-12}$ m/volt. An example of a ceramic material having these properties is C-5500, manufactured by Channel Industries. For transducer 10, in which the operational voltage produces a driving field parallel to the polarization field, $d_{33}$ governs the transducer motion.

For purposes of example, the width of each electrode strip 12, $d_e = 0.05$ inch, and the space between the edges of adjacent strips 12, $d_s = 0.10$ inch. Thus, if bar 11 is 3 inches long, it has 20 polarized regions. For an operational voltage, $V = 2000$ volts, the static strain of bar 11 may be approximated from the following formula:

$$\frac{\Delta L_m}{d_s + d_e} = d_{33} \frac{V}{d_s} \left[ \frac{L}{d_s + d_e} \right] \quad (1)$$

, where $\Delta L_m$ represents the static change in length of transducer 10. Substituting the above-specified, $\Delta L_m = 24 \times 10^{-6}$ meter. As explained below, the accuracy of this calculation is improved using an alternative transducer embodiment having embedded electrode strips.

The fundamental mechanical resonance frequency of transducer 10 may be calculated by treating bar 11 as a beam and using the formula for free-free or free-clamped rectangular beams in air:

$$f_1 = \frac{\lambda_{1F}}{2\pi L^2} \sqrt{\frac{YI}{m}} \quad (2)$$

, where $\lambda_{1F}$ is the eigenvalue for the beam flexural resonance fundamental mode, Y is Young's modulus of the ceramic material of bar 11, I is the area moment of inertia about a neutral axis of the beam cross section ($T^3 \times W / 12$), m is the mass per unit length of the beam ($\rho \times A$), $\rho$ is the mass density of the ceramic material, and A is the cross section area of the beam ($T \times W$).

For the typical ceramic described above, $Y = 5.2 \times 10^{10}$ N/m$^2$ and $\rho = 7.60 \times 10^3$ kg/m$^3$. For the body dimensions described above, $I = 1.734 \times 10^{-11}$ m$^4$ and $m = 0.24516$ kg/m. For $\lambda_{1F} = 4.73$, $f_1 = 1,175$ Hz.

As an alternative to the flexural motion of FIG. 4, a longitudinal motion can be produced with transducer 10. For this motion, transducer 10 is polarized as shown in FIG. 2, but the operational voltage connections to leads 13 are different. Lead A is connected to lead B' and lead B is connected to lead A'. Each side of bar 11 expands or contracts to produce the same strain in each part of bar 11 along its length. The value of the strain is expressed by Equation (1) above. The elongation is the same is that calculated above, which represents the total longitudinal displacement of bar if one end is fixed. These calculations ignore the effect of nonuniform polarization.

Cylindrical Transducer with Electrode Strips

Figure 5:
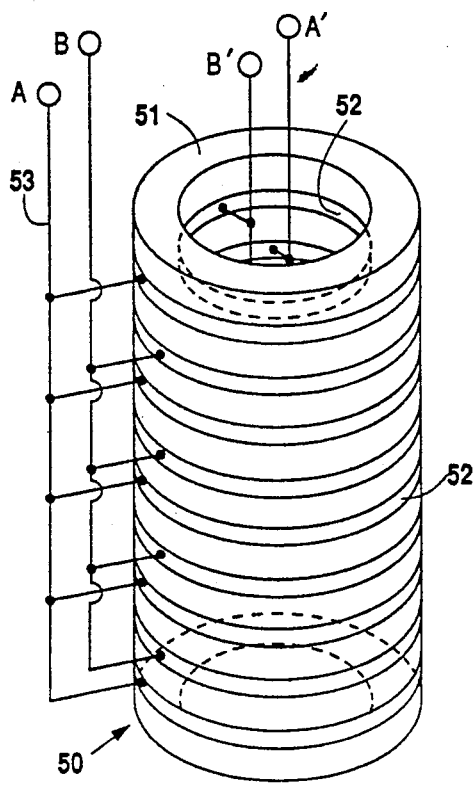
FIG. 5 illustrates a piezoelectric cylindrical transducer having electrode strips attached to the surface of the transducer body.

FIG. 5 illustrates a piezoelectric cylindrical transducer 50. In this embodiment of the invention, transducer 50 is comprised of a ceramic cylinder 51 and electrode strips 52. For purposes of example, the dimensions of cylinder 51 are 3 inches in length (L), 0.75 inch in radius (R), and 0.1 inch in wall thickness. The corresponding metric values are 0.0762 meter, 0.01905 meter, and 0.00254 meter, respectively.

Electrode strips 52 are placed around the outer circumference of cylinder 51 and around the inner circumference of cylinder 51, at spaced intervals along the length of cylinder 51. For each strip 52 on the outer circumference, there is an opposing strip 52 on the inner circumference.

In effect, transducer 50 is a modification of transducer 10, such that transducer 10 is wrapped into a cylinder shape. Like transducer 10, transducer 50 has a pair of leads 53 from each face of cylinder 51, one lead from each alternating strip 52 on each face. As explained below, the connections of leads 53 for polarization and operation are the same as for transducer 10 if transducer 10 were wrapped into a cylinder. However, the resulting motion is different.

Figure 6:
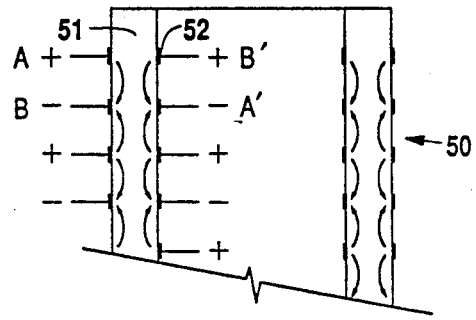
FIG. 6 illustrates the use of electrode strips to polarize the transducer of FIG. 5.

FIG. 6 illustrates the use of strips 52 to produce internal polarization of cylinder 51. Lead A is connected to lead B' and lead A' is connected to lead B. As a result, an applied voltage of like polarity exists with respect to each opposing strip 52. At each distance, $d_s$, down each cylindrical face of transducer 50, the applied voltage at each strip 52 changes from one polarity to the other, and the polarities at each strip 52 on opposing portions of the face are the same. When the polarization voltage is connected, the polarizing process is similar to that described above in connection with transducer 10. As with transducer 10, transducer 50 has a non-uniform polarizing field along its length.

Figure 7:
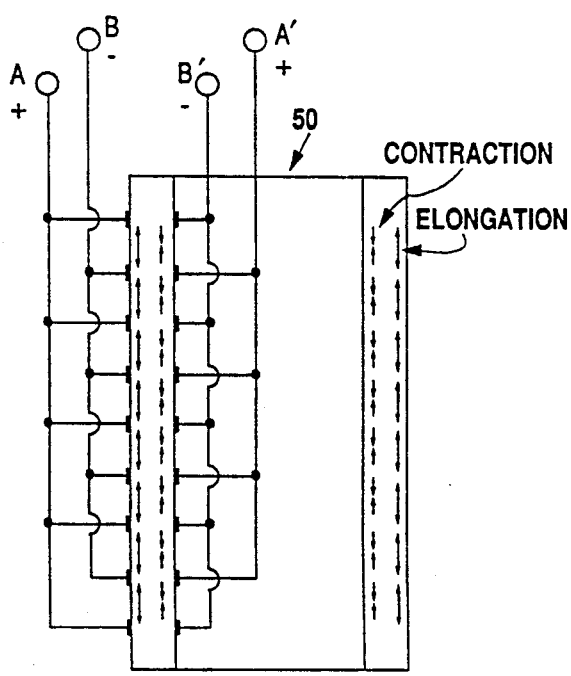
FIG. 7 illustrates the use of electrode strips to operate the transducer of FIG. 5.

FIG. 7 illustrates the connections of the transducer leads 53 for operation, and the resulting stresses produced in cylinder 51. Lead A is connected to lead A' and lead B is connected to lead B'. As a result, opposing strips 52 have opposite applied polarities. The operational voltage causes an extensional strain along the length in the outer region of the wall of cylinder 51 and a contractional strain along the length of the inner region of the wall of cylinder 51, or vice versa, depending on the polarity of the applied voltage. Transducer 50 is, in effect, divided into an inner cylinder and an outer cylinder by the difference between the polarizations and the operational voltages on opposite faces of transducer 50.

Figure 8:
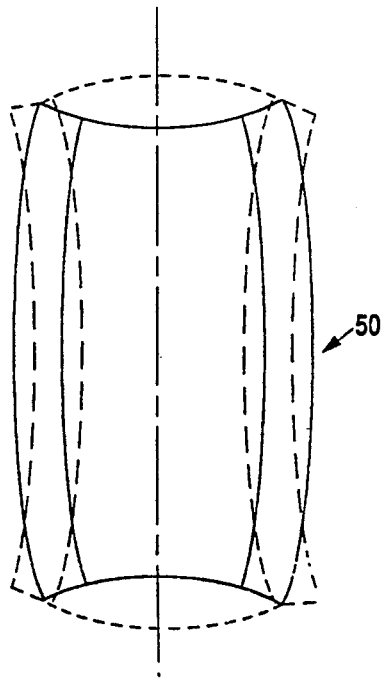
FIG. 8 illustrates the transducer motion when energized as shown in FIG. 7.

FIG. 8 illustrates the inward and outward flexural bending motion of transducer 50 as a result of the applied voltage illustrated in FIG. 7. The flexural displacements are symmetrical about the axis of cylinder 51. If the applied voltage is oscillatory, the internal stresses result in back and forth flexural motions.

For a cylinder 51 of the same thickness as bar 11, the values of the strains illustrated in FIG. 7 are the same as those discussed in connection with FIG. 3. However, the geometry of cylinder 51 imposes constraints on the resulting motion of transducer 50. An elastic constraint, represented by the Poisson transverse stiffness, and a negative transverse piezoelectric coupling, represented by a negative circumferential strain, contribute to circumferential rigidity of cylinder 51. The result is that the flexural bending is reduced and the natural resonance frequencies are increased.

The axi-symmetrical flexural resonance frequency of transducer 50 is primarily governed by the dimensions of cylinder 51 and the physical parameters of the ceramic material used for cylinder 51. To a lesser extent, the frequency is governed by the piezoelectric properties of the ceramic. Thus, by treating cylinder 51 as a tubular beam or a cylindrical shell, the approximate natural frequencies for the principal vibration modes may be determined.

The fundamental mechanical resonance frequency of a homogenous cylindrical shell in air, and therefore the resonance of transducer 50, for free-free or for clamped-clamped ends, is:

$$f_1 = \frac{1}{2\pi R} \sqrt{\frac{Y}{\rho(1-\sigma)^2}} \quad (3)$$

, where $\sigma$ is Poisson's ratio for the material used for cylinder 51.

As an example of determining the resonance of transducer 50, and assuming the same piezoelectric material as described above in connection with transducer 10, and using a Poisson's ratio of 0.33, then $f_1 = 23,150$ Hz.

The accuracy of the above resonance formula is reduced if the length resonance of transducer 50 is coupled with its radial resonance. For these coupled resonance modes, the radius and length of cylinder 51 must satisfy the following relationship:

$$R = \frac{L}{\pi} \sqrt{\frac{4+3\sigma}{1-\sigma^2}} \quad (4)$$

Using the same values for R and $\sigma$ as in the example $L = 0.041$ m. Adverse effects of coupled resonance may be avoided by making $L >> R$, by damping the undesirable resonances, or by designing transducer 50 to have resonances above the intended operating frequency range.

Bar Transducer with Embedded Electrode Strips

Figure 9:
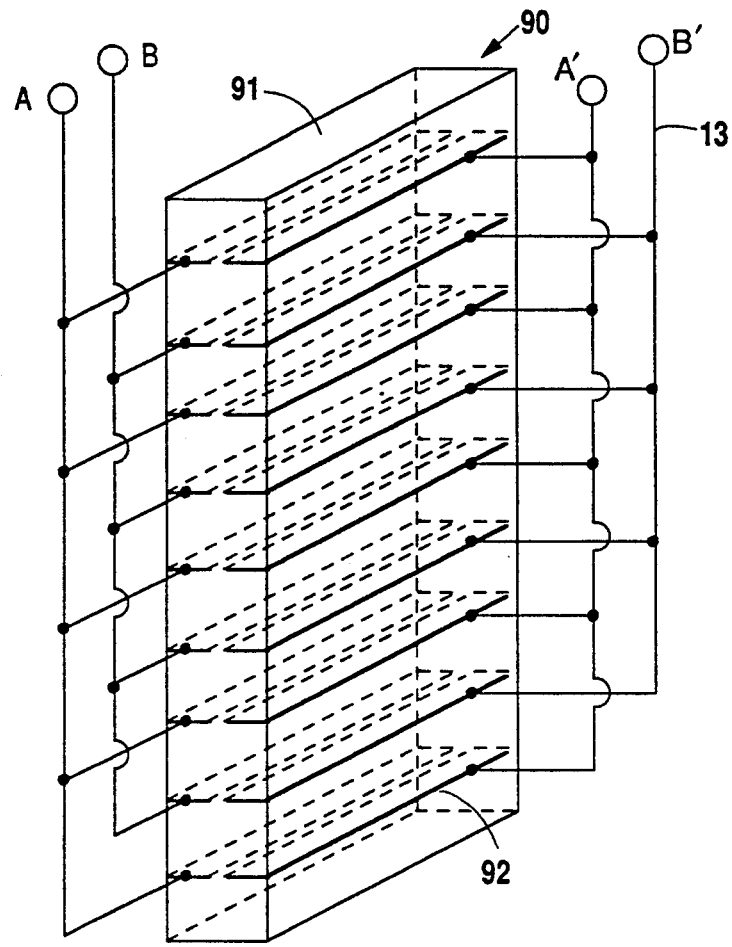
FIG. 9 illustrates a piezoelectric bar transducer having embedded electrode strips.

FIG. 9 illustrates a bar transducer 90, comprised of a bar 91 and embedded electrode strips 92. The electrode strips are placed within the body of bar 91, using known techniques for obtaining internal conductive interfaces within the body of a ceramic material.

Electrode strips 92 are placed perpendicular to the plane of each face of bar 91 at spaced intervals along its length. Each strip extends toward the mid-thickness of bar 91, but does not reach the mid-thickness, such that a gap exists between opposing strips 92.

In a manner similar to that described above in connection with transducer 10, alternating strips 92 on each face of bar 91 are connected to a voltage source. These interconnections are via two leads 93 from the strips 92 on each face, for a total of four leads 93.

Figure 10:
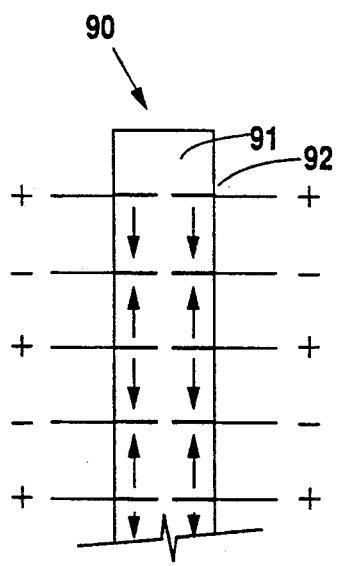
FIG. 10 illustrates the use of electrode strips to polarize the transducer of FIG. 9.

FIG. 10 illustrates the use of strips 92 to produce internal polarization of bar 91. Lead A is connected to lead A' and lead B is connected to lead B'. Like transducer 10, transducer 90 acquires a length-oriented polarization that changes with each region between strips 92. However, unlike transducer 10, the polarization is uniform within each internal region defined by the strips 92. The result is a transducer that is more sensitive than a comparable transducer having surface electrode strips. Also, the surface area of each electrode strip 92 may be increased, which provides better electromechanical coupling in the piezoelectric transduction process and increased self capacitance.

Figure 11:
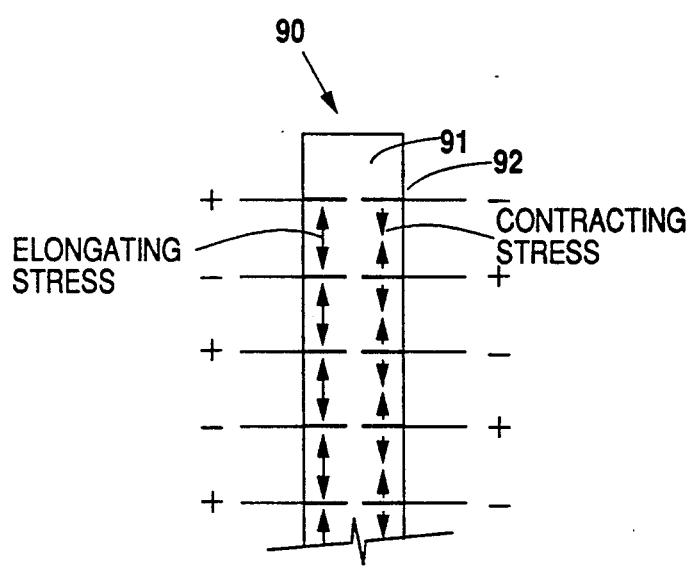
FIG. 11 illustrates the use of electrode strips to operate the transducer of FIG. 9.

FIG. 11 illustrates the interconnection of leads 93 for operation of transducer 90 and the resulting internal stresses within bar 91. Lead A is connected to lead B', and lead B is connected to lead B'. The resulting internal stresses are similar to those described in connection with FIG. 3.

The resulting motion of transducer 90 is a flexural bending similar to that illustrated in FIG. 4. The internal strains are governed by the $d_{33}$ piezoelectric strain constant, discussed above in connection with Equation (1).

Cylindrical Transducer with Embedded Electrode Strips

Figure 12:
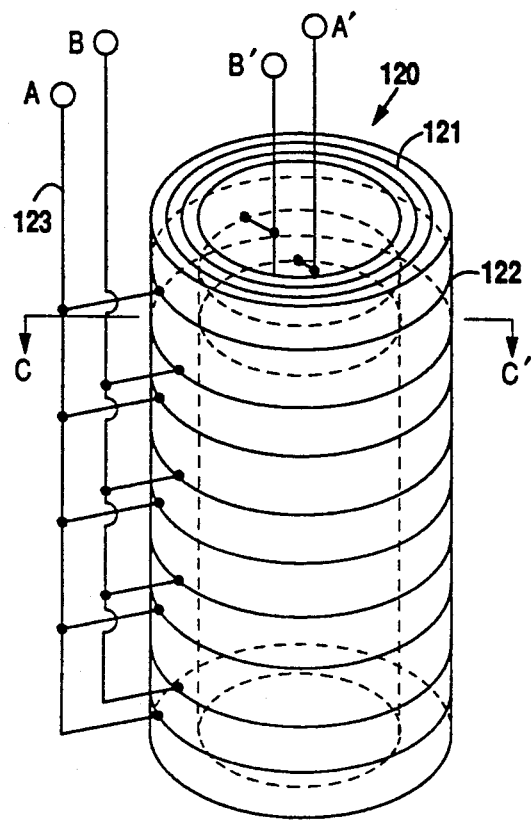
FIG. 12 illustrates a piezoelectric cylinder transducer having embedded electrode strips.

FIG. 12 illustrates a cylindrical transducer 120, comprising a cylinder 121 and embedded electrode strips 122.

Figure 13:
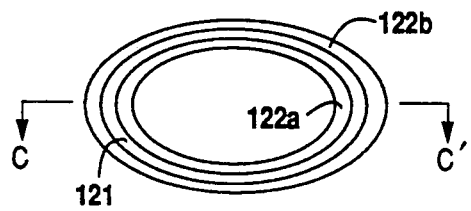
FIG. 13 is a cross sectional view of the transducer of FIG. 12 in the plane of an embedded electrode strip.

FIG. 13 is a cross sectional view of transducer 120 on a plane containing electrode strips 122. The electrode strips 122 are arranged in spaced planes that are perpendicular to the axis of cylinder 121. An inner strip 122a and an outer strip 122b are on each plane. Inner strip 122a and outer strip 122b are thus concentric with respect to each other. Each pair of concentric strips 122 is separately accessible to leads 123 at the outer and inner surfaces of cylinder 121, but are electrically spaced and isolated at the mid-thickness of cylinder 121.

Figure 14:
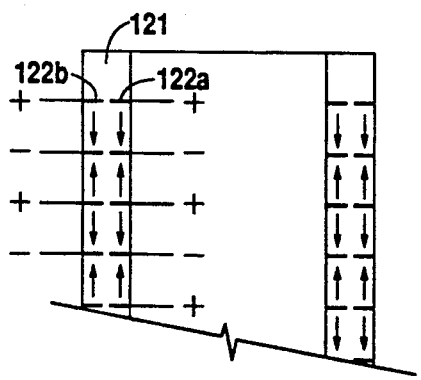
FIG. 14 illustrates the use of electrode strips to polarize the transducer of FIG. 12.

FIG. 14 illustrates the polarization of transducer 120 and the applied voltage for achieving this polarization. The arrangement of electrode strips 122 are interconnected by connecting lead A to lead A' and connecting lead B to lead B'. The result is length-oriented polarization. As with transducer 90, the polarization is uniform in each region defined by strips 122, and this uniform polarization provides improved operation.

Figure 15:
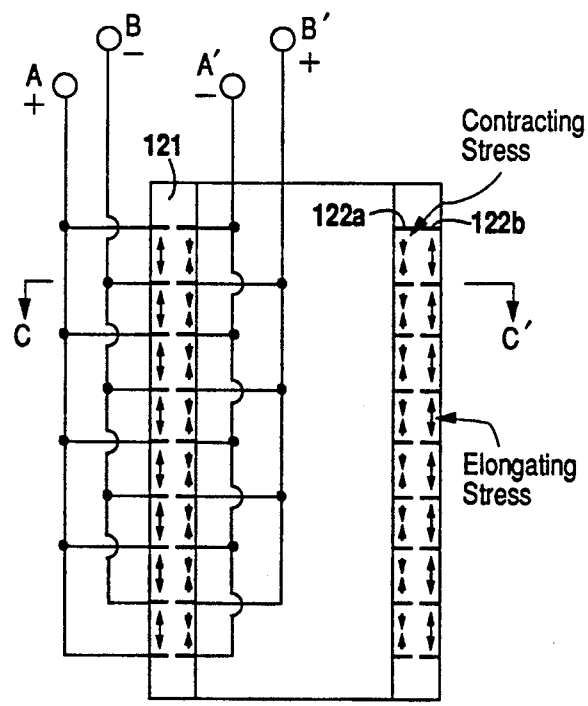
FIG. 15 illustrates the use of electrode strips to operate the transducer of FIG. 12.

FIG. 15 illustrates the applied voltage for operation of transducer 120, and the resulting internal stresses. Lead A is connected to lead B' and lead A' is connected to lead B. The result is oppositely expanding and contracting stresses in outer and inner parts of cylinder 121. These stresses produce axi-symmetrical flexural displacements of the transducer 120, as shown in FIG. 8.

The internal strains in the inner and outer parts of transducer 120 are governed by the $d_{33}$ piezoelectric strain constant, as discussed above in connection with Equation (1).

Cylindrical Transducers for Selective Vibration Modes

Figure 16:
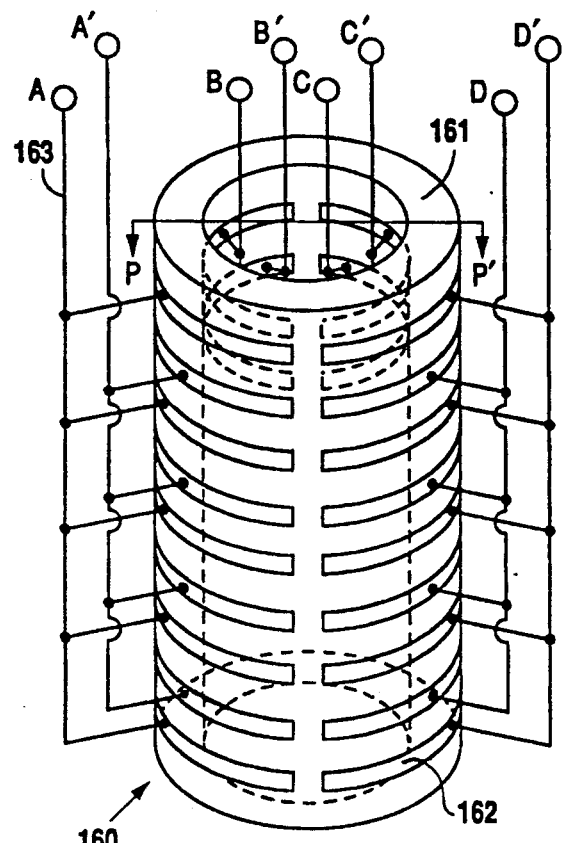
FIG. 16 illustrates a piezoelectric cylindrical transducer having electrode strips attached to the transducer body, such that either axi-symmetrical or asymmetrical motion may be produced.

FIG. 16 illustrates a cylindrical transducer 160, which is designed to operate in either an axi-symmetrical or an asymmetrical mode. Asymmetrical mode flexural motion is used for acoustic dipole source applications. As explained below, transducer 160 is a modification of transducer 50. Transducer 120 may be similarly modified for this selective operation. The distinguishing characteristic of these embodiments is the circumferential separation between the electrode strips.

Transducer 160 has a structural similar to that of transducer 50, having a cylindrical body 161 and electrode strips 162, except that strips 162 are each circumferentially separated into two sections, so as to isolate cylinder 161 into two half cylinder parts. Each part may be independently connected to a voltage source for purposes of polarization and operation. Thus, transducer 160 has eight leads 163, which are herein referred to as leads A, A', B, B', C, C', D, and D'.

Figure 17:
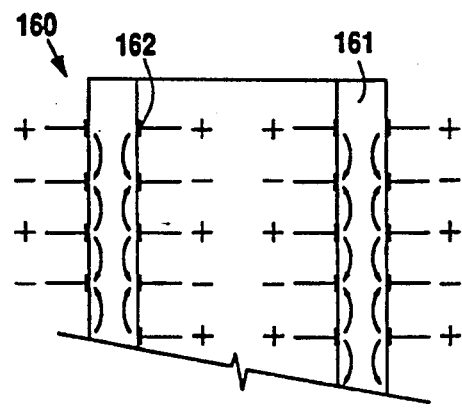
FIG. 17 illustrates the use of electrode strips to polarize the transducer of FIG. 16.

FIG. 17 illustrates the use of strips 162 to polarize transducer 160. The polarization fields are the same as described in connection with FIG. 6. Each strip 162 has the same polarity as its opposing strip 162.

Figure 18:
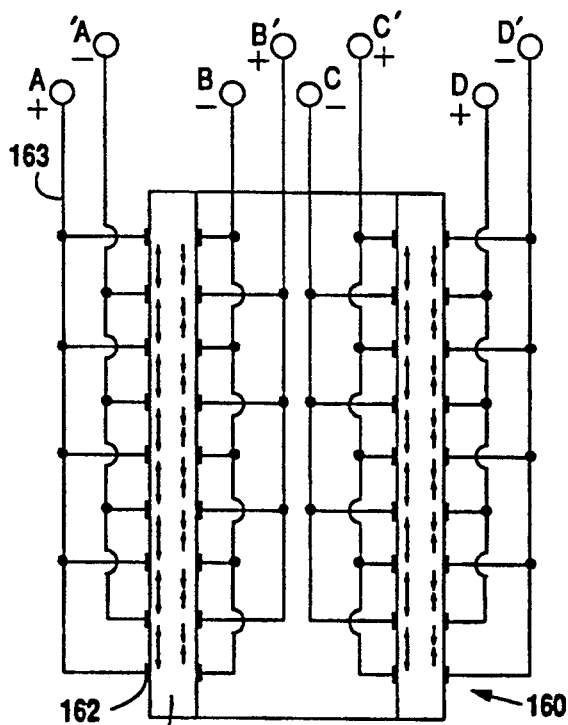
FIG. 18 illustrates the use of electrode strips to operate the transducer of FIG. 16.

FIG. 18 illustrates the use of strips 162 to connect transducer 160 to an operational voltage, and the resulting internal stresses. Leads A, B', C', and D are connected together and leads A', B, C, and D' are connected together. Each strip 162 has a polarity opposite that of its opposing strip.

Figure 19:
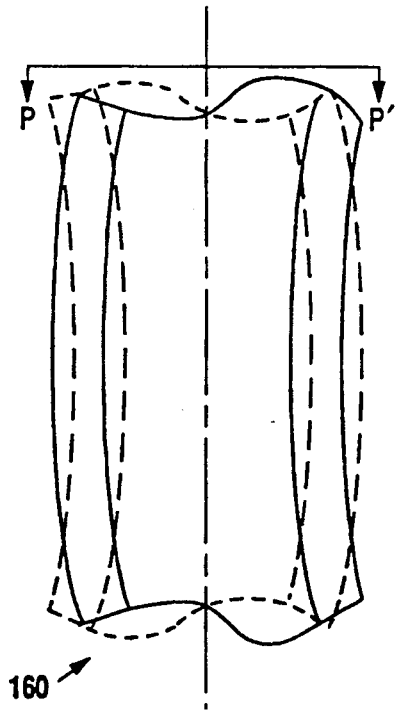
FIG. 19 illustrates the motion of the transducer of FIG. 16.

FIG. 19 illustrates the asymmetrical motion of transducer 160. If the operational voltage is oscillatory, transducer 160 vibrates in the plane P—P'.

Although not illustrated, the embedded electrode transducer 120 may also be modified to produce asymmetrical vibrations. For this use, embedded electrode strips 122 are circumferentially separated in a manner similar to surface electrode strips 162 of transducer 160. Eight leads are used, and the connections for polarizing and operating the transducer are similar to those of transducer 160.

Transducers such as either transducer 160 or transducer 120, modified as explained in this section, are selectively operated as axi-symmetrical mode vibrators or asymmetrical mode vibrators by appropriate connection of their electrodes. For example, when the lead designations defined above for a modified transducer 160 are connected as described above, i.e., leads A, B', C', and D connected together and leads A', B, C, and D' connected together, transducer 160 will produce asymmetrical vibrations. With leads A, B, C', and D' connected together and leads A', B', C, and D connected together, transducer 160 will produce axi-symmetrical vibrations.

Cylindrical Transducers for Multi-pole Applications

The concept of isolated electrode strips applied to the surface of a cylindrical transducer body or embedded within it, can be extended to acoustic multi-pole applications.

Transducers 50 and 120 exhibit axi-symmetrical radial displacements that correspond to the pulsation motions of a simple point source, i.e., a monopole, when the wavelength of the radiated sound is large in comparison to the transducer's dimensions.

Transducer 50 and 120, having their electrode strips circumferentially separated into two sections, exhibit asymmetrical vibrations that correspond to the pulsation motion of two point sources having opposite polarity, i.e., a dipole.

Transducers 50 and 120 can be alternatively modified by arranging their electrode strips to divide the transducer body into arc segments of the cylinder to form a quadrapole, i.e., two diametrically-oriented point sources operating in phase plus two diametrically-oriented point sources placed orthogonally to the first pair and operating 180 degrees out of phase. Higher order multi-pole sources have additional pairs of point sources arranged at equiangular spacings, and their elements operate in opposite phase with respect to the adjacent sources.

Other Embodiments

Although the invention has been described with reference to specific embodiments, this description is not meant to be construed in a limiting sense. Various modifications of the disclosed embodiments, as well as alternative embodiments will be apparent to persons skilled in the art. It is, therefore, contemplated that the appended claims will cover all modifications that fall within the true scope of the invention.

What is claimed is:

1. A piezoelectric transducer for generating or receiving mechanical vibrations, comprising:

a planar shaped body made from a piezoelectric material, having a front planar surface and a back planar surface;

electrode strips embedded in said body, at spaced intervals down each surface of said body, such that each strip is normal to the surface of said body, for connecting the transducer to a voltage source such that said electrode strips may be selectively energized;

wherein each electrode strip at one surface of said body is opposite to, but spaced from, an opposing electrode strip at the other surface of said body, such that any pair of electrode strips at either surface of said body forms a defined region to be uniformly energized by said electrode strips.

2. The transducer of claim 1, wherein said body is polarized, such that at each surface, regions between successive pairs of strips are oppositely polarized.

3. The transducer of claim 2, wherein said body is polarized such that opposing regions of said outer and said inner surface have the same polarity.

4. A piezoelectric transducer for generating or receiving mechanical vibrations, comprising:
   a cylindrical shaped body made from a piezoelectric material, having an outer cylindrical surface and an inner cylindrical surface;
   electrode strips embedded in said body, at spaced intervals down each surface of said body, such that each strip is normal to the surface of said body, for connecting the transducer to a voltage source such that said electrode strips may be selectively energized;
   wherein each electrode strip at one surface of said body is opposite to, but spaced from, an opposing electrode strip at the other surface of said body, such that any pair of electrode strips at either surface of said body forms a defined region to be uniformly energized by said electrode strips.

5. The transducer of claim 4, wherein said body is polarized, such that at each surface, regions between successive pairs of strips are oppositely polarized.

6. The transducer of claim 5, wherein said body is polarized such that opposing regions of said outer and said inner surface have the same polarity.

7. The transducer of claim 4, wherein each of said strips is circumferentially separated into two strips, such that each separated strip extends across approximately one half the circumference of said cylindrical body.

* * * * *